United States Patent
Lee et al.

(10) Patent No.: US 8,166,238 B2
(45) Date of Patent: Apr. 24, 2012

(54) METHOD, DEVICE, AND SYSTEM FOR PREVENTING REFRESH STARVATION IN SHARED MEMORY BANK

(75) Inventors: Dong-Hyuk Lee, Seoul (KR);
Kyung-Woo Nam, Seoul (KR);
Yong-Jun Kim, Hwaseong-Si (KR);
Jong-Wook Park, Suwon-Si (KR);
Chi-Sung Oh, Gunpo-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 634 days.

(21) Appl. No.: 11/977,047

(22) Filed: Oct. 23, 2007

(65) Prior Publication Data

US 2009/0106503 A1 Apr. 23, 2009

(51) Int. Cl.
*G11C 11/406* (2006.01)
(52) U.S. Cl. .. 711/106; 711/149; 711/156; 711/E12.103
(58) Field of Classification Search .................. None
See application file for complete search history.

(56) References Cited

U.S. PATENT DOCUMENTS

| | | | | |
|---|---|---|---|---|
| 4,630,230 A * | 12/1986 | Sundet | ............ | 711/169 |
| 4,796,232 A * | 1/1989 | House | ............ | 365/189.03 |
| 5,140,681 A | 8/1992 | Uchiyama et al. | ............ | 395/425 |
| 5,682,498 A * | 10/1997 | Harness | ............ | 711/106 |
| 5,890,219 A * | 3/1999 | Scaringella et al. | ............ | 711/162 |
| 6,604,176 B1 * | 8/2003 | MacLellan et al. | ............ | 711/149 |
| 7,353,327 B1 * | 4/2008 | Dorst | ............ | 711/104 |
| 2002/0078311 A1 * | 6/2002 | Matsuzaki et al. | ............ | 711/149 |
| 2004/0128433 A1 * | 7/2004 | Bains | ............ | 711/106 |
| 2007/0022245 A1 * | 1/2007 | Sohn et al. | ............ | 711/106 |
| 2007/0070794 A1 * | 3/2007 | Lee et al. | ............ | 365/233 |
| 2008/0263286 A1 * | 10/2008 | Jeong et al. | ............ | 711/149 |

OTHER PUBLICATIONS

Michael Singer. "Samsung to hit mobile-memory milestone." Nov. 2005. CNET News.*

* cited by examiner

*Primary Examiner* — Reginald Bragdon
*Assistant Examiner* — Nathan N Sadler
(74) *Attorney, Agent, or Firm* — Monica H. Choi

(57) ABSTRACT

A multi-port memory device includes a refresh register and a refresh controller for preventing refresh starvation in a shared memory unit of the memory device. The memory device further includes a plurality of ports sharing access to the shared memory unit. The refresh register stores information regarding at least one refresh command. The refresh controller determines whether to activate an internal refresh operation at a transition in port authority according to such information stored in the refresh register.

23 Claims, 13 Drawing Sheets

METHOD, DEVICE, AND SYSTEM FOR PREVENTING REFRESH STARVATION IN SHARED MEMORY BANK

TECHNICAL FIELD

The present invention relates generally to refresh operations in a memory device such as a DRAM (dynamic random access memory) device, and more particularly, to preventing refresh starvation in a multi-port memory device.

BACKGROUND OF THE INVENTION

FIG. 1 shows a block diagram of a multi-port memory device 100 which may be a multi-port DRAM (dynamic random access memory) device for example. The multi-port memory device 100 includes a first port 102, a second port 104, a first memory bank 106, a second memory bank 108, a third memory bank 110, a fourth memory bank 112, and an access controller 114.

The first memory bank 106 is dedicated for access just by a first data processor (not shown) via the first port 102. The third and fourth memory banks 110 and 112 are dedicated for access just by a second data processor (not shown) via the second port 104. The second memory bank 108 has shared access by the first and second data processors via the first and second ports 102 and 104, respectively.

Just one of the ports 102 and 104 has access to the shared memory bank 108 at any given time. The access controller 114 arbitrates access to the shared memory bank 108 between the ports 102 and 104. On the other hand, the first port 102 has access to its dedicated bank, i.e., the first memory bank 106, at any time. Similarly, the second port 104 has access to its dedicated banks, i.e., the third and fourth memory banks 110 and 112, at any time.

FIG. 2 illustrates how refresh starvation may result in the multi-port memory device 100 of FIG. 1 with a timing diagram of signals. Referring to FIGS. 1 and 2, the authority controller 114 generates an authority signal that indicates which of the ports 102 and 104 is authorized for access to the shared memory bank 108. In FIG. 2, each of the first and second ports 102 and 104 generates CBR (CAS (column address strobe) before RAS (row address strobe)) commands to the shared memory bank 108. Each CBR command is issued for instructing the shared memory bank 108 to execute an auto-refresh command.

In FIG. 2, CBR commands are issued by the ports 102 and 104 when the port does not have authority for access to the shared memory bank 108. Thus, the auto-refresh command is not executed in the shared memory bank 108 resulting in refresh starvation in the shared memory bank 108.

FIG. 3 is a timing diagram for further illustrating such refresh starvation in the shared memory bank 108. Referring to FIGS. 2 and 3, the first memory bank 106 executes all of the CBR commands from the first port 102. Similarly, each of the third and fourth memory banks 110 and 112 executes all of the CBR commands from the second port 104.

The shared memory bank 108 executes a CBR command from the first or second port 102 or 104 when such a CBR command is issued with proper authority for access to the shared memory bank 108. Thus, unauthorized CBR commands (outlined in dashed lines with an X in FIG. 3) from the first and second ports 102 and 104 are not executed by the shared memory bank 108.

Thus in the example of FIG. 3, each of the dedicated banks 106, 110, and 112 executes seven auto-refresh commands. However, the shared memory bank 108 executes only five auto-refresh commands. Such lower number of auto-refresh operations performed in the shared memory bank 108 may result in refresh starvation with the memory cells not having sufficient charge for proper operation.

FIG. 4 shows a timing diagram of signals during operation of the memory device 100 of FIG. 1 for preventing refresh starvation. Referring to FIG. 4, each of the data processors coupled to the ports 102 and 104 generates a respective CBR command immediately before transition of port authority. Thus, a refresh operation is performed in the shared memory bank 108 immediately around each transition of port authority.

The timing diagram of FIG. 5 is similar to FIG. 3 but with the additional refresh operations 120 being performed in the shared memory bank 108 near each transition of port authority. In FIG. 5, a total of ten refresh operations are performed in the shared memory bank 108 compared to a total of five refresh operations in FIG. 3. Although refresh starvation is thus prevented in FIG. 5, execution of each refresh operation requires time and power consumption. Thus, performing a refresh operation in the shared memory bank 108 at each transition of port authority may result in slow operation and high power consumption in the memory device 100.

Thus, a mechanism for preventing refresh starvation with fewer refresh operations in a shared memory bank of a multi-port memory device is desired.

SUMMARY OF THE INVENTION

Accordingly, in a general aspect of the present invention, a multi-port memory device includes a refresh register and a refresh controller for preventing refresh starvation in a shared memory unit of the memory device. The memory device further includes a plurality of ports sharing access to the shared memory unit. The refresh register stores information regarding at least one refresh command from the plurality of ports. The refresh controller determines whether to activate an internal refresh operation at a transition in port authority according to such information stored in the refresh register.

In another embodiment of the present invention, the memory device further includes an authority controller for generating a port authority signal indicating the port authority between the ports.

In an example embodiment of the present invention, the refresh register is set by the refresh controller when an unauthorized refresh command is generated. In addition, the refresh controller controls the shared memory unit to perform an internal refresh operation at a subsequent transition in port authority after the refresh register is set. Furthermore, the refresh controller resets the refresh register after such an internal refresh operation has been activated in the shared memory unit. In that case, the refresh controller controls the shared memory unit to not perform an internal refresh operation in the shared memory unit at another subsequent transition in port authority after the refresh register is reset.

In a further embodiment of the present invention, the refresh controller sets the refresh register when another unauthorized refresh command is generated after the refresh register has been reset. In that case, the refresh controller controls the shared memory unit to perform an internal refresh operation at another subsequent transition in port authority after the refresh register is thus set.

In another embodiment of the present invention, the refresh controller sets the refresh register when an unauthorized refresh command is generated from any of the plurality of ports. Alternatively, the refresh controller sets the refresh register when any type of refresh command is generated only from a predetermined one of the plurality of ports.

In a further embodiment of the present invention, the refresh register stores a refresh count that is incremented by the refresh controller every time an unauthorized refresh command is generated. In that case, the refresh controller controls the shared memory unit to perform an internal refresh operation at a subsequent transition in port authority if the refresh count is greater than zero. Also in that case, the refresh controller decrements the refresh count after such an internal refresh operation in the shared memory unit is activated. Alternatively, the refresh controller further decrements the refresh count every time an authorized refresh command is executed in the shared memory unit.

The present invention may be used to particular advantage when the memory device is a semiconductor DRAM (dynamic random access memory) device, and when the shared memory unit is a shared memory bank. However, the present invention may also be used for other types of multi-port memory devices having refresh operations.

In this manner, the shared memory bank is controlled to execute more internal refresh operations to prevent refresh starvation in the multi-port memory device. In addition, the number of internal refresh operations is not excessive for maintaining operating speed and low power consumption.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and/or function.

DETAILED DESCRIPTION

Figure 6:
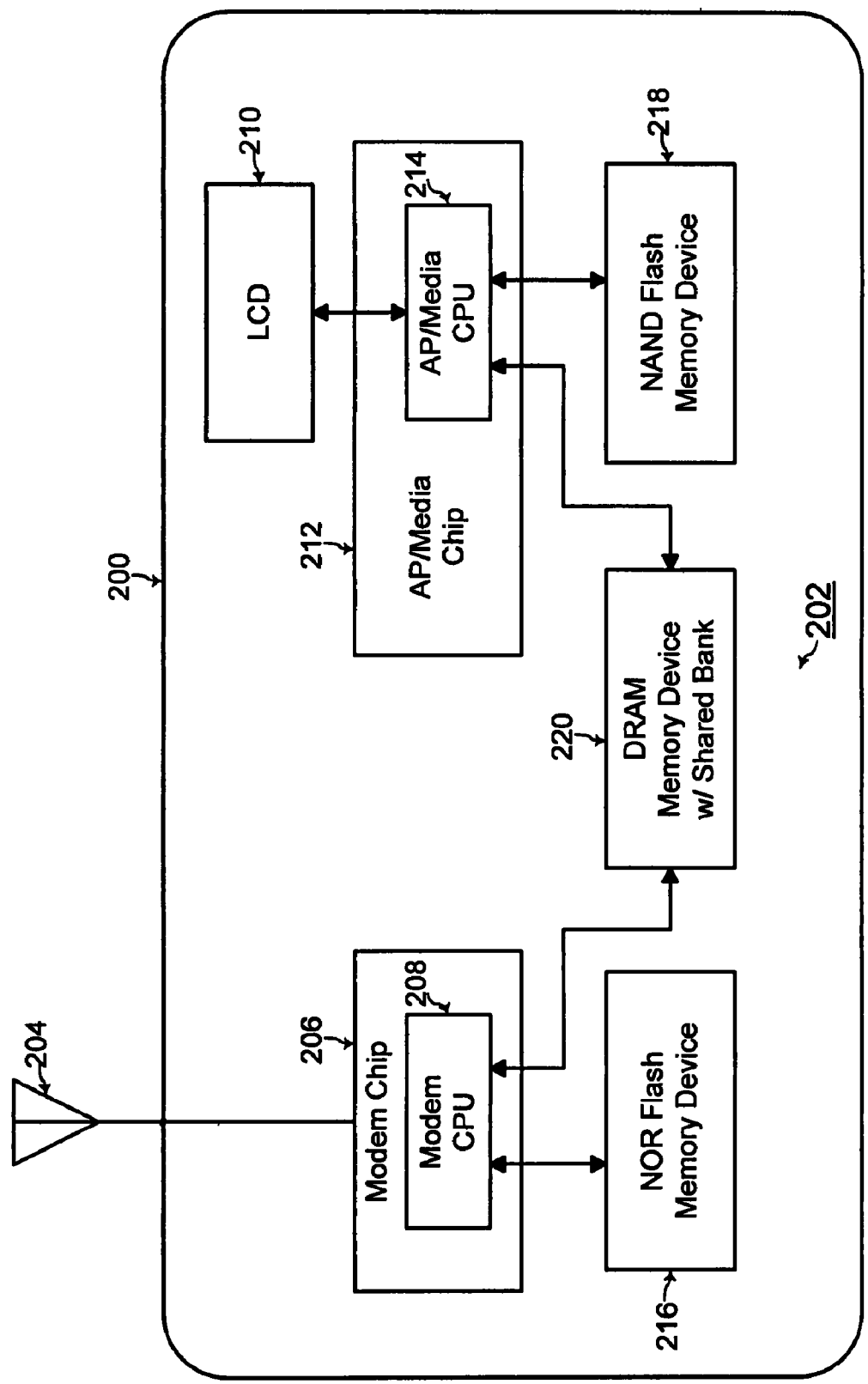
FIG. 6 shows a block diagram of a mobile device having a memory system with prevention of refresh starvation, according to an embodiment of the present invention.

FIG. 6 shows a block diagram of a mobile device 200 having a memory system 202 with prevention of refresh starvation according to an embodiment of the present invention. Such a mobile device 200 may be a cell phone for example with an antenna 204 for connecting with a wireless communication system.

The mobile device 200 includes a modem chip 206 with a modem data processor 208 for providing communication functionality. The mobile device 200 also includes a LCD (liquid crystal display) 210 and an AP (application processor)/media chip 212 with an AP (application processor)/media data processor 214 for providing display functionality.

The memory system 202 of the mobile device 200 includes a NOR flash memory device 216 accessed just by the modem data processor 208 for providing the communication functionality. The memory system 202 also includes a NAND flash memory device 218 accessed just by the AP/media data processor 214 for providing the display functionality.

The memory system 202 also includes a multi-port memory device 220 that is shared for access by both the modem data processor 208 and the AP/media data processor 214. The multi-port memory device 220 is a multi-port semiconductor DRAM (dynamic random access memory) device according to an embodiment of the present invention.

Figure 7:
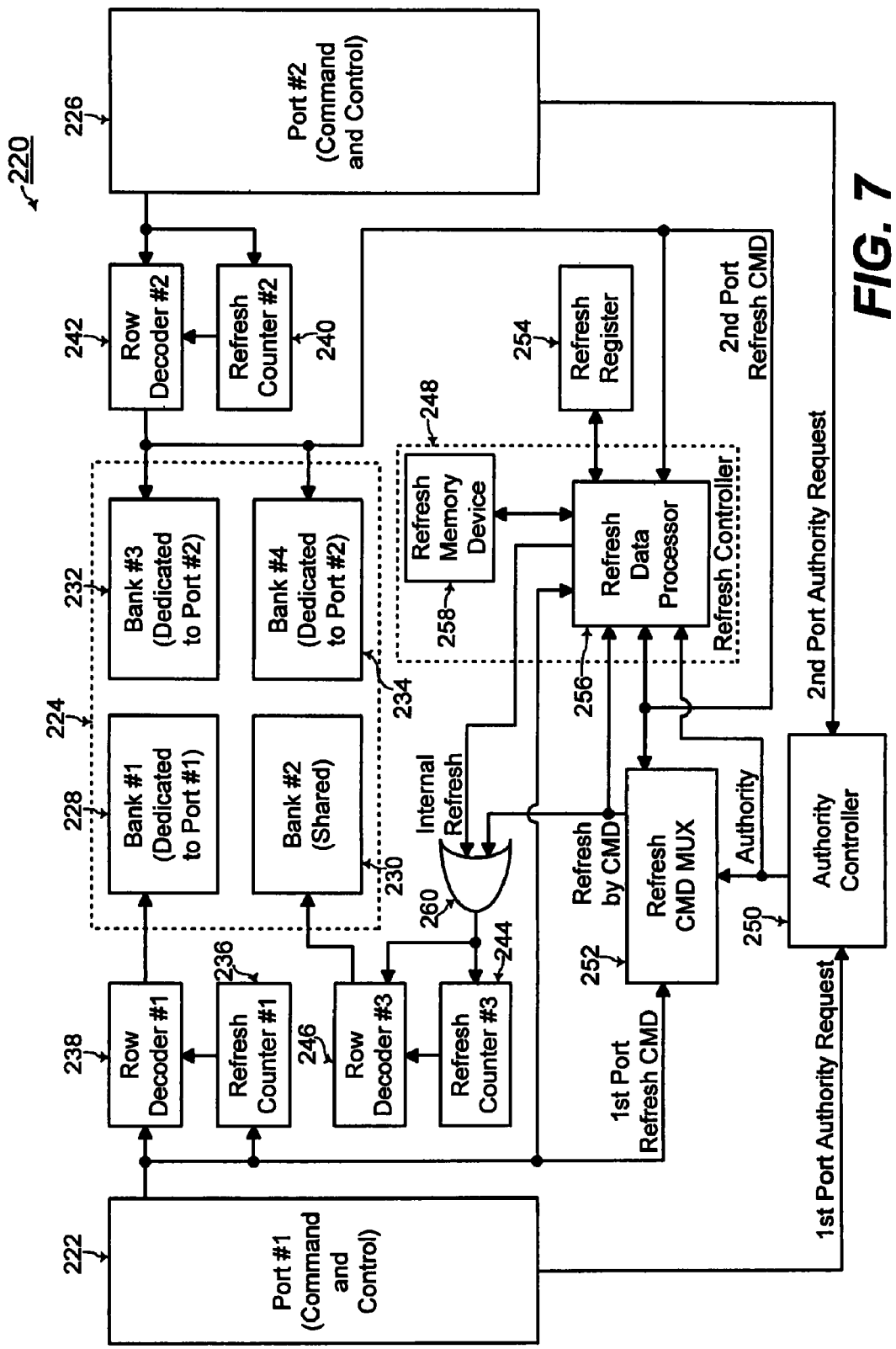
FIG. 7 shows a block diagram of a multi-port memory device with prevention of refresh starvation in the memory system of FIG. 6, according to an embodiment of the present invention.

FIG. 7 shows a block diagram of the multi-port shared memory device 220 of FIG. 6 with prevention of refresh starvation, according to an example embodiment of the present invention. The multi-port shared memory device 220 includes a first port 222 for access by the modem data processor 208 to a core 224 having an array of memory cells fabricated therein. The multi-port shared memory device 220 also includes a second port 226 for access by the AP/media data processor 214 to the core 224.

The core 224 is organized into a first memory bank 228, a second memory bank 230, a third memory bank 232, and a fourth memory bank 234. The first memory bank 228 is dedicated to be accessed just by the modem data processor 208 via the first port 222. The third and fourth memory banks 232 and 234 are dedicated to be accessed just by the AP/media data processor 214 via the second port 226. The second memory bank 230 is shared for access by both the modem data processor 208 and the AP/media data processor 214 via the first and second ports 222 and 226, respectively.

The multi-port shared memory device 220 includes a first refresh counter 236 and a first row decoder 238 that are used for executing an auto-refresh command from the first port 222 in the first memory bank 228. The multi-port shared memory device 220 also includes a second refresh counter 240 and a second row decoder 242 that are used for executing an auto-refresh command from the second port 226 in the third and fourth memory banks 232 and 234. The multi-port shared memory device 220 further includes a third refresh counter 244 and a third row decoder 246 that are used for executing a refresh command from one of the first and second ports 222 and 226 or from a refresh controller 248, in the shared memory bank 230 for preventing refresh starvation therein.

In addition, the multi-port shared memory device 220 includes an authority controller 250 that generates a port authority signal indicating port authority for access to the shared memory bank 230 to one of the first and second ports 222 and 226 at any given time. The multi-port shared memory device 220 also includes a refresh command multiplexer 252 that selects a refresh command from one of the first and second ports 222 and 226 to be executed in the shared memory bank 230 according to the authority signal from the authority controller.

Furthermore, the multi-port shared memory device 220 includes a refresh register 254 and the refresh controller 248 for generating internal refresh commands to be executed by the shared memory bank 230 for preventing refresh starvation therein. The term "internal refresh operation" refers to a refresh operation performed in the memory device 220 from activation by the refresh controller 248. In contrast, the term "auto refresh operation" or "command refresh operation" refers to a refresh operation performed in the memory device 220 from execution of a refresh command generated from one of the ports 222 and 226.

The refresh controller 248 includes a data processor 256 and a memory device 258 having sequences of instructions (i.e., software) stored thereon. Execution of such sequences of instructions by the data processor 256 causes the data processor 256 to perform any functionality described herein with reference to FIGS. 8, 9, 10, 11, 12, and 13 for the refresh data processor 256 and/or the refresh controller 248. However, the present invention may also be practiced with different types of implementations for the refresh controller 248 such as with logic circuitry for example.

The multi-port shared memory device 220 further includes an OR-gate 260 that generates an output signal for controlling the third refresh counter 244 and the third row decoder 246. The third refresh counter 244 and the third row decoder 246 are controlled by the OR-gate 260 such that a refresh operation is performed in the shared memory bank 230 if the refresh command multiplexer 252 indicates an authorized refresh command generated from one of the first and second ports 222 and 226 or if the refresh controller 248 activates an internal refresh operation.

For example, the refresh command multiplexer 252 activates a Refresh by CMD (Command) signal to a logic high state when an authorized refresh command is generated from one of the first and second ports 222 and 226. Similarly, the refresh controller 248 activates an Internal Refresh signal to the logic high state for indicating that the shared memory bank 230 is to execute an internal refresh operation. The OR-gate 260 inputs such a Refresh by CMD signal from the refresh command multiplexer 252 and such an Internal Refresh signal from the refresh controller 248.

The output of the OR-gate 260 is input by the third refresh counter 244 and the third row decoder 246. When the output of the OR-gate 260 is activated to the logic high state, the third refresh counter 244 increments to a next address of the shared memory bank 230. In that case, the third row decoder 246 decodes such an incremented address from the third refresh counter 244 and controls the shared memory bank 230 to perform a refresh operation on such an incremented address of the shared memory device 203 as indicated by the third refresh counter 244.

Operation of the memory device 220 of FIG. 7 for preventing refresh starvation in the shared memory bank 230 is now described.

Figure 8:
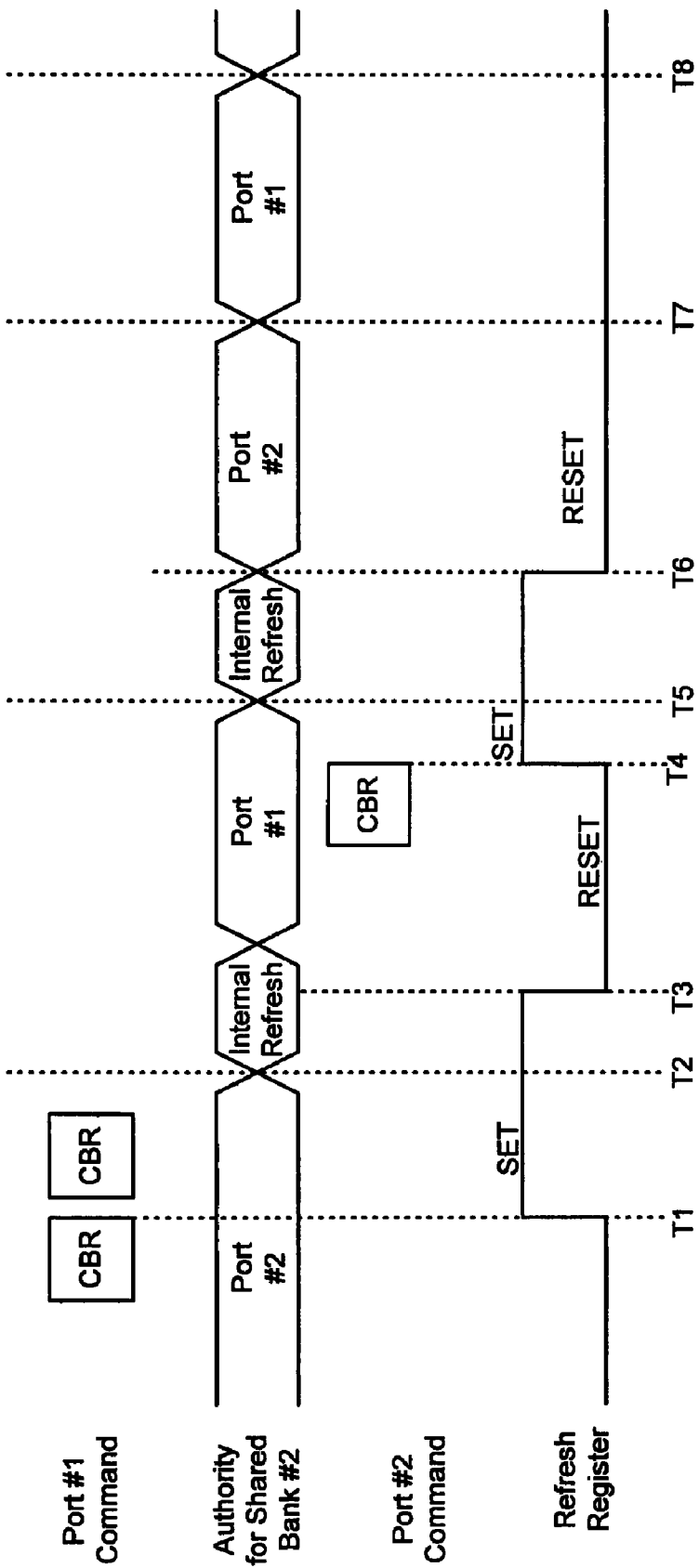
FIGS. 8 and 9 each show a timing diagram for illustrating prevention of refresh starvation by setting and resetting a refresh register, according to an embodiment of the present invention.

FIG. 8 shows a timing diagram of signals during operation of the memory device 220 of FIG. 7 when the refresh register 254 is a 1-bit register according to an embodiment of the present invention. The refresh register 254 of FIG. 7 may be implemented with any type of data storage device storing at least such 1-bit. Referring to FIGS. 7 and 8, each of the ports 222 and 226 requests port authority for accessing the shared memory bank 230 to the authority controller 250. The authority controller 250 generates a port Authority signal for indicating which one of the ports 222 and 226 has authority for access to the shared memory bank 230.

Further referring to FIGS. 7 and 8, the refresh data processor 256 sets the 1-bit data stored in the refresh register 254 to a logic high state whenever any of the ports 222 and 226 generates an unauthorized refresh (CBR) command. For example, the first port 222 generates an unauthorized CBR command while the port authority is for the second port 226. Similarly, the second port 226 generates an unauthorized CBR command while the port authority is for the first port 222.

For example in FIG. 8, the refresh data processor 256 sets the 1-bit of the refresh register 254 to a logic high state at time point T1 when the first port 222 issues an unauthorized CBR command. Any additional unauthorized CBR command generated before the subsequent transition of port authority maintains the 1-bit of the refresh register 254 to be set to the logic high state. Thereafter, upon subsequent transition of the port authority from the second port 226 to the first port 222 at time point T2, the refresh data processor 256 activates the Internal Refresh signal to the logic high state since the 1-bit of the refresh register 254 has been set to the logic high state.

As a result of such activation of the Internal Refresh signal, the third refresh counter 244 increments an address, and the third row decoder 246 controls the shared memory bank 230 to perform a refresh operation at the incremented address as indicated by the third refresh counter 244. After start of such a refresh operation such as at time point T3 in FIG. 8, the refresh data processor 256 resets the 1-bit of the refresh register 254 to a logic low state and deactivates the Internal Refresh signal to the logic low state.

Further referring to FIG. 8, subsequently at time point T4, the 1-bit of the refresh register 254 set again to the logic high state when the second port 226 issues an unauthorized CBR command. Thereafter, upon subsequent transition of the port authority from the first port 222 to the second port 226 at time point T5, the refresh data processor 256 activates the Internal Refresh signal to the logic high state since the 1-bit of the refresh register 254 has been set to the logic high state.

As a result of such activation of the Internal Refresh signal, the third refresh counter 244 again increments the generated address, and the third row decoder 246 controls the shared memory bank 230 to perform a refresh operation at the incremented address as indicated by the third refresh counter 244. After start of such a refresh operation such as at time point T6 in FIG. 8, the refresh data processor 256 resets the 1-bit of the refresh register 254 to a logic low state and deactivates the Internal Refresh signal to the logic low state.

The 1-bit of the refresh register 254 remains reset to the logic low state as long as no unauthorized CBR command is generated from any of the ports 222 and 226. Thus, at any subsequent transition of port authority such as at time points T7 and T8 in FIG. 8, the refresh data processor 256 maintains the Internal Refresh signal to be deactivated at the logic low state. Consequently, no internal refresh operation is performed in the shared memory bank 230 at such subsequent transitions of port authority.

Figure 9:
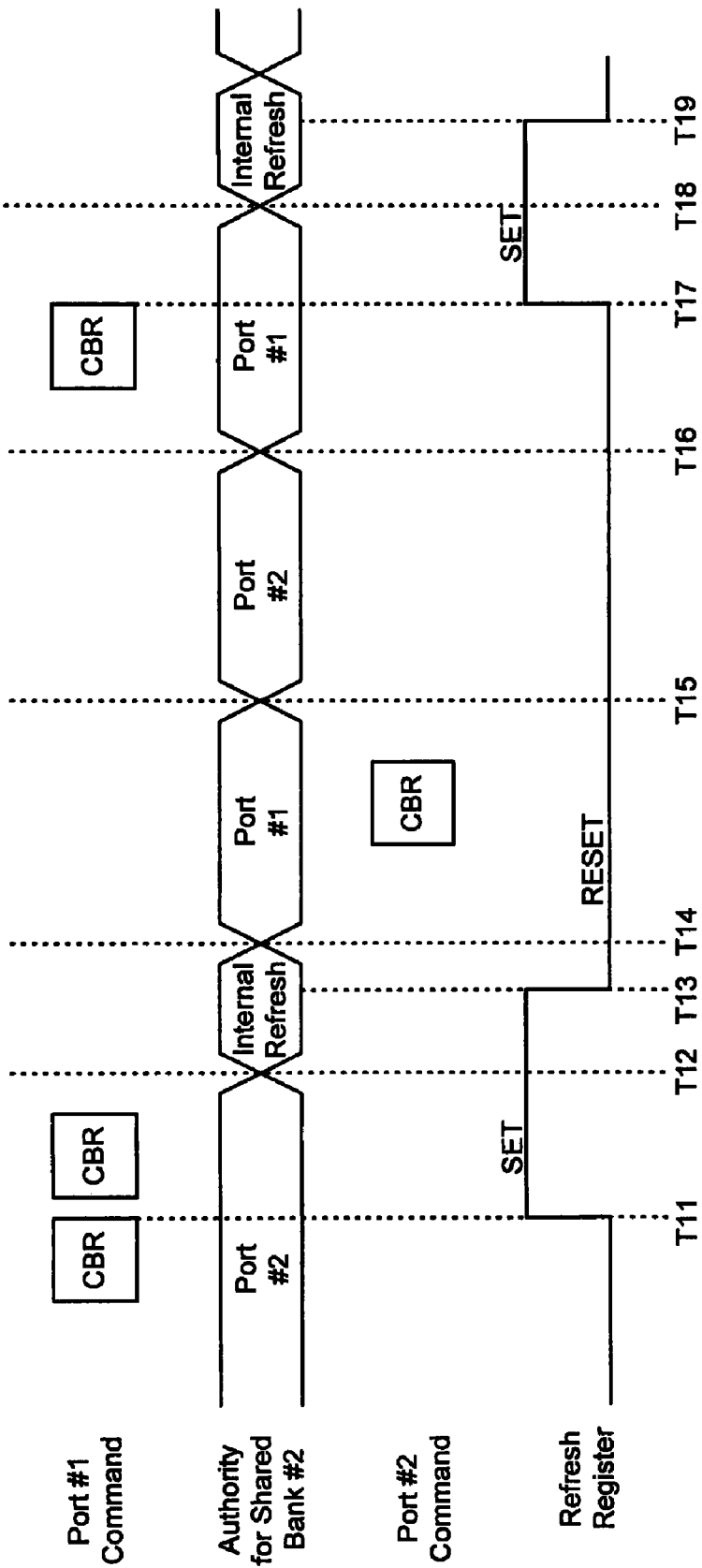

FIG. 9 shows a timing diagram of signals during operation of the memory device 220 of FIG. 7 when any type of CBR command from just a predetermined one of the ports 222 and 226 is used for setting the 1-bit refresh register 254, according to another embodiment of the present invention. In the embodiment of FIG. 9 for example, any type (authorized or unauthorized) of CBR command from just the first port 222 is used for setting the 1-bit of the refresh register 254.

For example in FIG. 9, the refresh data processor 256 sets the 1-bit of the refresh register 254 to the logic high state at time point T11 when the first port 222 issues a CBR command (that is unauthorized). Any additional CBR command generated by the first port 222 before the subsequent transition of port authority maintains the 1-bit of the refresh register 254 to be set to the logic high state. Thereafter, upon subsequent transition of the port authority from the second port 226 to the first port 222 at time point T12, the refresh data processor 256 activates the Internal Refresh signal to the logic high state since the 1-bit of the refresh register 254 has been set to the logic high state.

As a result of such activation of the Internal Refresh signal, the third refresh counter 244 increments its generated address, and the third row decoder 246 controls the shared memory bank 230 to perform a refresh operation at the incremented address as indicated by the third refresh counter 244. After start of such a refresh operation such as at time point T13 in FIG. 9, the refresh data processor 256 resets the 1-bit of the refresh register 254 to the logic low state and deactivates the Internal Refresh signal to the logic low state.

Note that in FIG. 9, any CBR command from just the first port 222 is used for setting the 1-bit refresh register 254. Thus, any CBR command from the second port 226 is ignored for purposes of setting the 1-bit refresh register 254. For example in FIG. 9, the unauthorized CBR command generated by the second port 226 between time points T14 and T15 when the first port 222 has authority for access to the shared memory bank 230 does not set the 1-bit refresh register 254.

With the 1-bit refresh register 254 being reset after time point T13 in FIG. 9, no internal refresh operation is performed in the shared memory device 230 with control from the refresh controller 248 at the subsequent transitions in port authority at time points T15 and T16. The 1-bit refresh register 254 is set again to the logic high state at time point T17 when the predetermined port 222 generates another CBR command (that is authorized). Thereafter, upon subsequent transition of the port authority from the first port 222 to the second port 226 at time point T18, the refresh data processor 256 activates the Internal Refresh signal to the logic high state since the 1-bit of the refresh register 254 has been set to the logic high state.

As a result of such activation of the Internal Refresh signal, the third refresh counter 244 increments its generated address, and the third row decoder 246 controls the shared memory bank 230 to perform a refresh operation at the incremented address as indicated by the third refresh counter 244. After start of such a refresh operation such as at time point T19 in FIG. 9, the refresh data processor 256 resets the 1-bit of the refresh register 254 to the logic low state and deactivates the Internal Refresh signal to the logic low state.

The 1-bit of the refresh register 254 remains reset to the logic low state as long as no CBR command is generated from the predetermined port 222. Thus, no internal refresh operation is performed in the shared memory bank 230 at any subsequent transition of port authority until a CBR command is again generated from the predetermined port 222. In this manner with the embodiment of FIG. 9, the number of refresh operations performed in the shared memory bank 230 is greater than or equal to the number of refresh operations performed in the memory bank 228 dedicated for access by the predetermined port 222.

Figure 10:
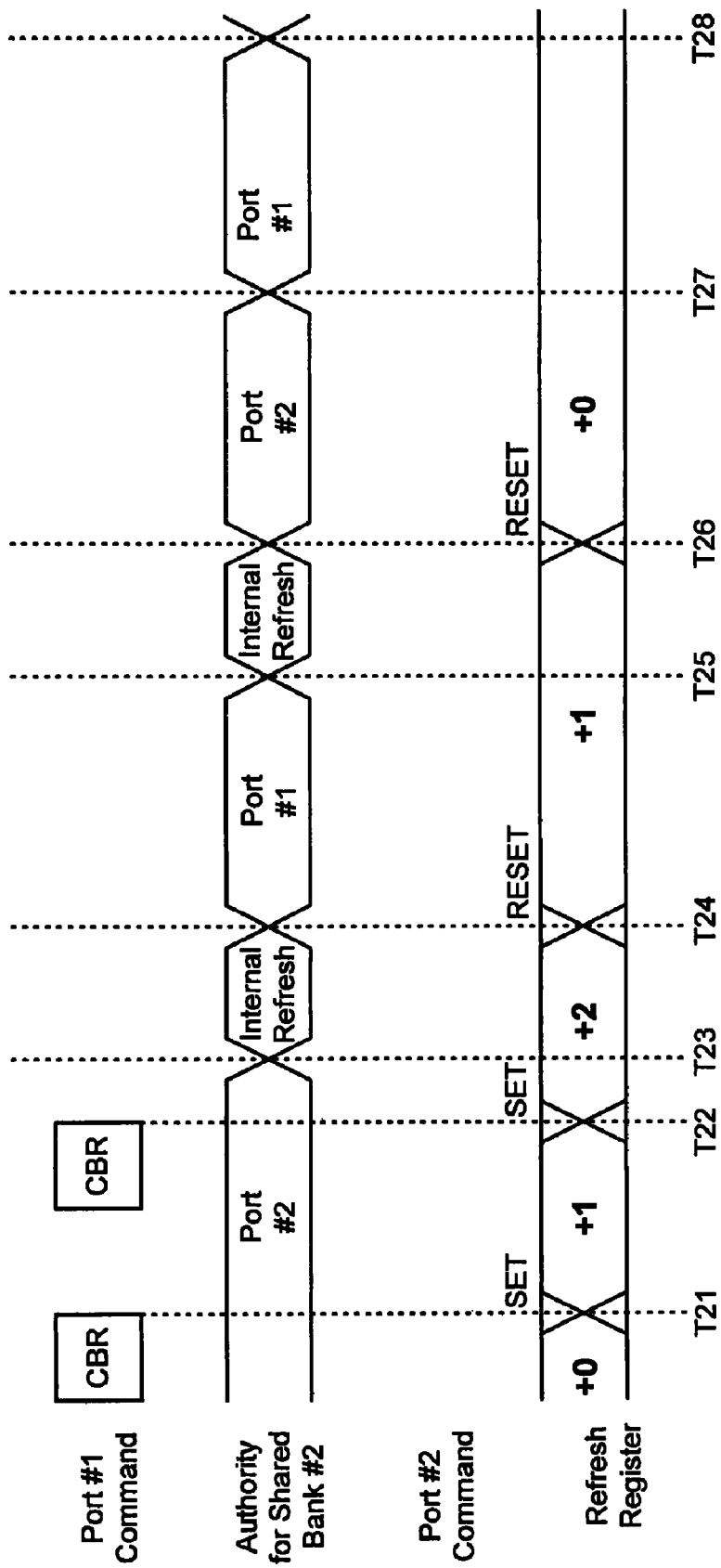
FIGS. 10 and 11 each show a timing diagram for illustrating prevention of refresh starvation by tracking a count of internal refresh operations to be performed, according to another embodiment of the present invention.

FIG. 10 shows a timing diagram of signals during operation of the memory device 220 of FIG. 7 when the refresh register 254 is a multi-bit register according to another embodiment of the present invention. In that case, the refresh register 254 of FIG. 7 may be implemented with any type of data storage device storing at least such multi-bits. Further referring to FIGS. 7 and 10, the refresh data processor 256 controls the refresh register 254 to store a count of unauthorized CBR commands generated by any of the first and second ports 222 and 226. Thus, the refresh data processor 256 controls the refresh register 254 to increment a count of unauthorized CRB commands when any of the ports 222 and 226 generates an unauthorized CBR command.

Further in the embodiment of FIG. 10, upon any transition of port authority, the refresh data processor 256 sets the Internal Refresh signal to the logic high state if the count of unauthorized CBR commands as stored in the refresh register 254 is greater than zero. With the Internal Refresh signal becoming activated to the logic high state, the third refresh counter 244 increments an address, and the third row decoder 246 controls the shared memory bank 230 to perform a refresh operation at such an incremented address from the third refresh counter 244. Additionally in the embodiment of FIG. 10, the refresh data processor 256 controls the refresh register 254 to decrement the count of unauthorized CRB commands when a refresh operation is performed at the transition of port authority.

Referring to the example of FIG. 10, the refresh data processor 256 controls the refresh register 254 to increment its count to +1 with generation of an unauthorized CBR command from the first port 222 at time point T21. In addition, the refresh data processor 256 controls the refresh register 254 to increment its count to +2 with generation of another unauthorized CBR command from the first port 222 at time point T22.

At a subsequent transition of port authority at time point T23, the refresh data processor 256 sets the Internal Refresh signal to the logic high state since the count of unauthorized CBR commands as stored in the refresh register 254 is greater than zero. With the Internal Refresh signal becoming activated to the logic high state, the third refresh counter 244 increments an address, and the third row decoder 246 controls the shared memory bank 230 to perform an internal refresh operation at such an incremented address from the third refresh counter 244.

Additionally in FIG. 10, the refresh data processor 256 controls the refresh register 254 to decrement the count from +2 to +1 at time point T24 after such an internal refresh operation has been performed and deactivates the Internal Refresh signal to the logic low state. At a subsequent transition of port authority at time point T25, the refresh data processor 256 sets the Internal Refresh signal to the logic high state since the count of unauthorized CBR commands as stored in the refresh register 254 is still greater than zero. With the Internal Refresh signal becoming activated to the logic high state, the third refresh counter 244 increments its generated address, and the third row decoder 246 controls the shared memory bank 230 to perform another internal refresh operation at such an incremented address from the third refresh counter 244.

Additionally in FIG. 10, the refresh data processor 256 controls the refresh register 254 to decrement the count from +1 to +0 at time point T26 after such an internal refresh operation has been performed and deactivates the Internal Refresh signal to the logic low state. Thereafter, at subsequent transitions of port authority at time points T27 and T28 for example, no internal refresh operation is performed in the shared memory bank 230 since the count in the refresh register 254 is now zero. Thus, no internal refresh operation is performed in the shared memory bank 230 at subsequent transitions of port authority until the refresh register 254 increments its count upon generation of another unauthorized CBR command.

In this manner with the embodiment of FIG. 10, the number of refresh operations performed in the shared memory bank 230 is greater than or equal to the number of refresh operations performed in each of the memory banks 228, 232, and 234 dedicated for access by one of the ports 222 and 226.

Figure 11:
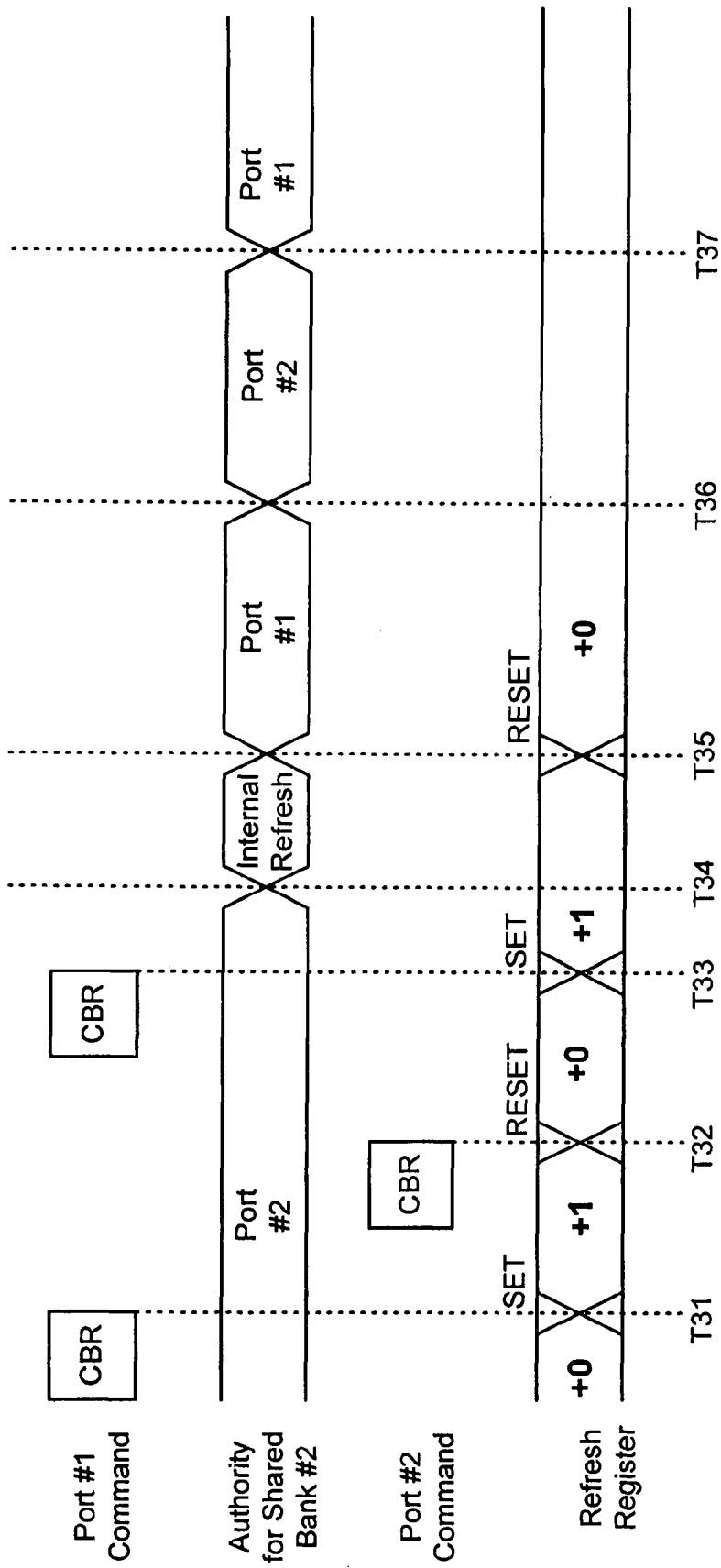

FIG. 11 shows a timing diagram of signals during operation of the memory device 220 when the refresh register 254 is a multi-bit register according to another embodiment of the present invention. The operation according to FIG. 11 is similar to the embodiment FIG. 10, but in FIG. 11, the count from the refresh register 254 is further decremented when an authorized CBR command is generated from any of the ports 222 and 226.

Referring to the example of FIG. 11, the refresh data processor 256 controls the refresh register 254 to increment its count to +1 with generation of an unauthorized CBR command from the first port 222 at time point T31. Subsequently, the refresh data processor 256 controls the refresh register 254 to decrement its count from +1 to +0 with generation of an authorized CBR command from the second port 226 at time point T32.

Thereafter in FIG. 11, the refresh data processor 256 controls the refresh register 254 to increment its count from +0 to +1 with generation of another unauthorized CBR command from the first port 222 at time point T33. At a subsequent transition of port authority at time point T34, the refresh data processor 256 sets the Internal Refresh signal to the logic high state since the count of unauthorized CBR commands as stored in the refresh register 254 is greater than zero. With the Internal Refresh signal becoming activated to the logic high state, the third refresh counter 244 increments an address, and the third row decoder 246 controls the shared memory bank 230 to perform an internal refresh operation at such an incremented address from the third refresh counter 244.

Figure 1:
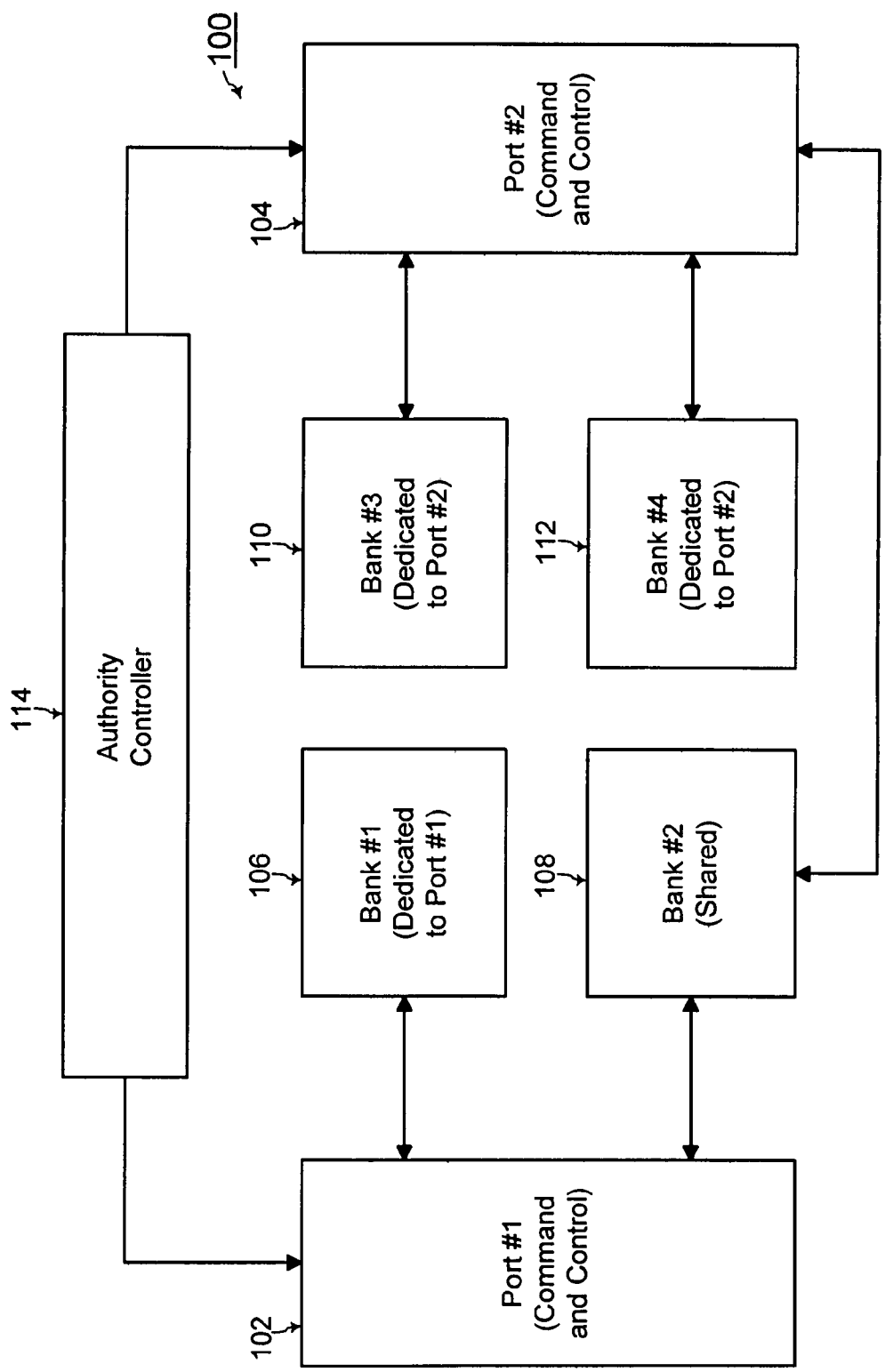
FIG. 1 shows a block diagram of a multi-port memory device having refresh starvation, according to the prior art.
Figure 2:
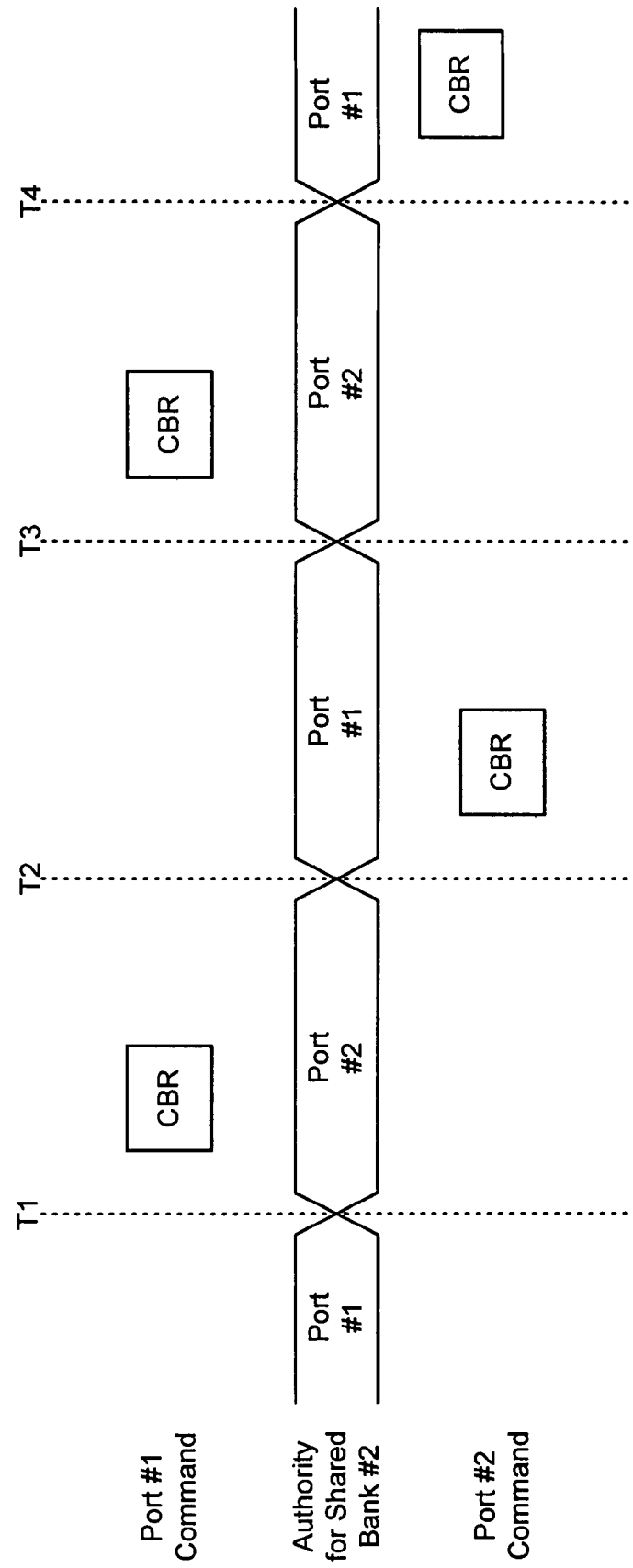
FIGS. 2 and 3 each show a timing diagram for illustrating refresh starvation in the memory device of FIG. 1, according to the prior art.
Figure 3:
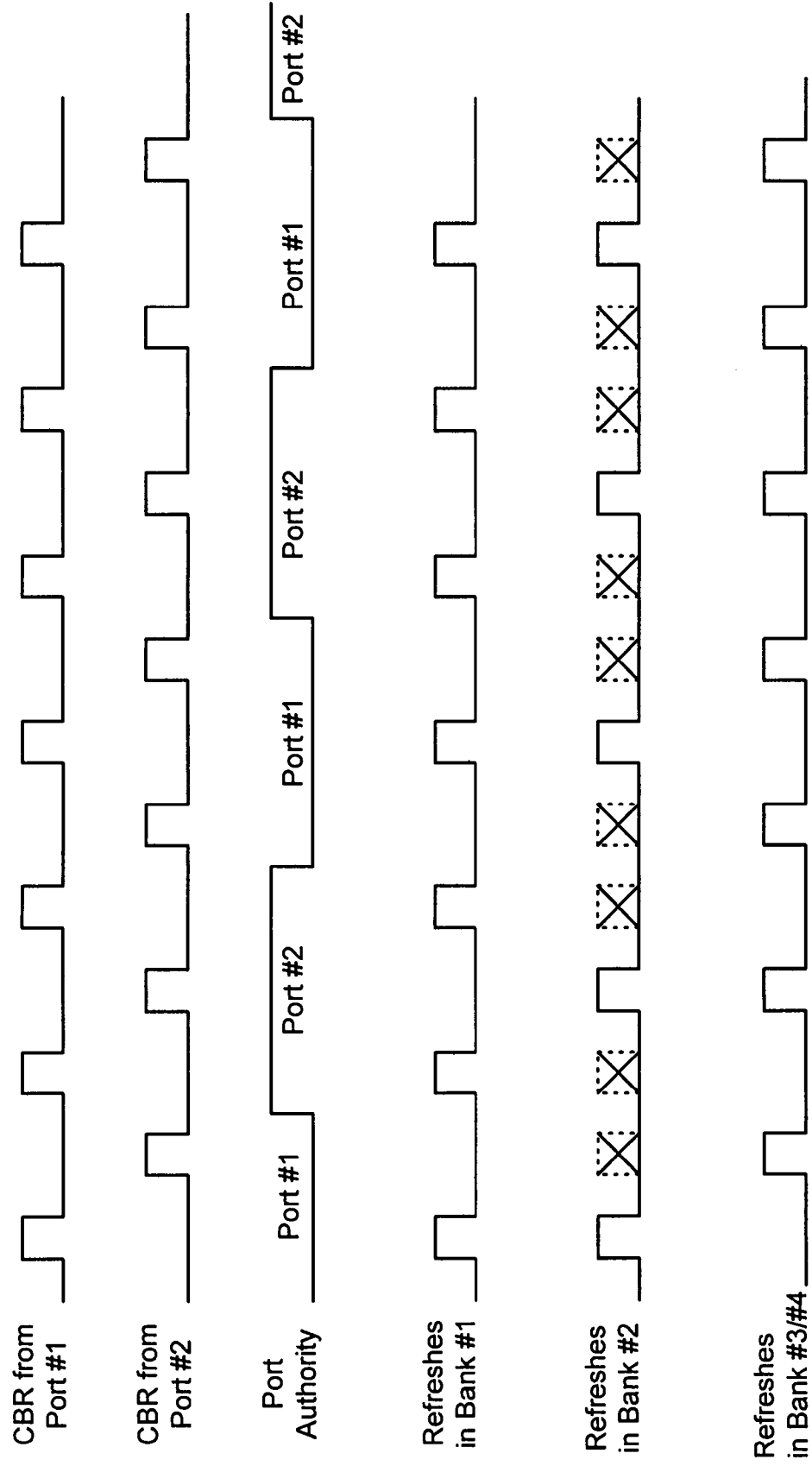

Additionally in FIG. 11, the refresh data processor 256 controls the refresh register 254 to decrement the count from +1 to +0 at time point T35 after such an internal refresh operation has been performed and deactivates the Internal Refresh signal to the logic low state. Thereafter in FIG. 1, at subsequent transitions of port authority at time points T36 and T37 for example, no internal refresh operation is performed in the shared memory bank 230 since the count in the refresh register 254 is now zero. Thus, no internal refresh operation is performed in the shared memory bank 230 at subsequent transitions of port authority until the refresh register 254 increments its count upon generation of another unauthorized CBR command.

Figure 4:
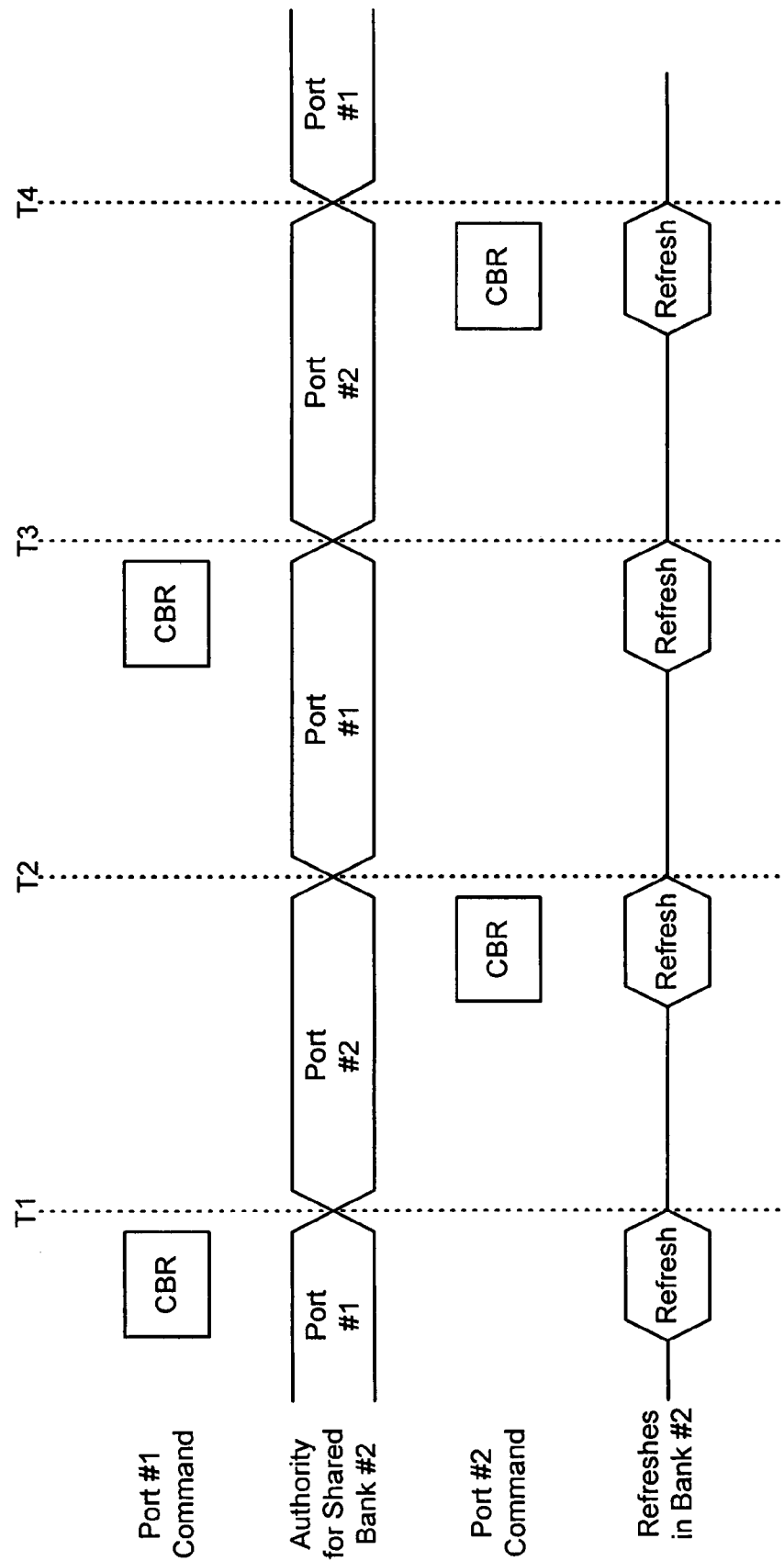
FIGS. 4 and 5 each show a timing diagram for illustrating prevention of refresh starvation with internal refresh operations performed at each transition of port authority, according to the prior art.
Figure 5:
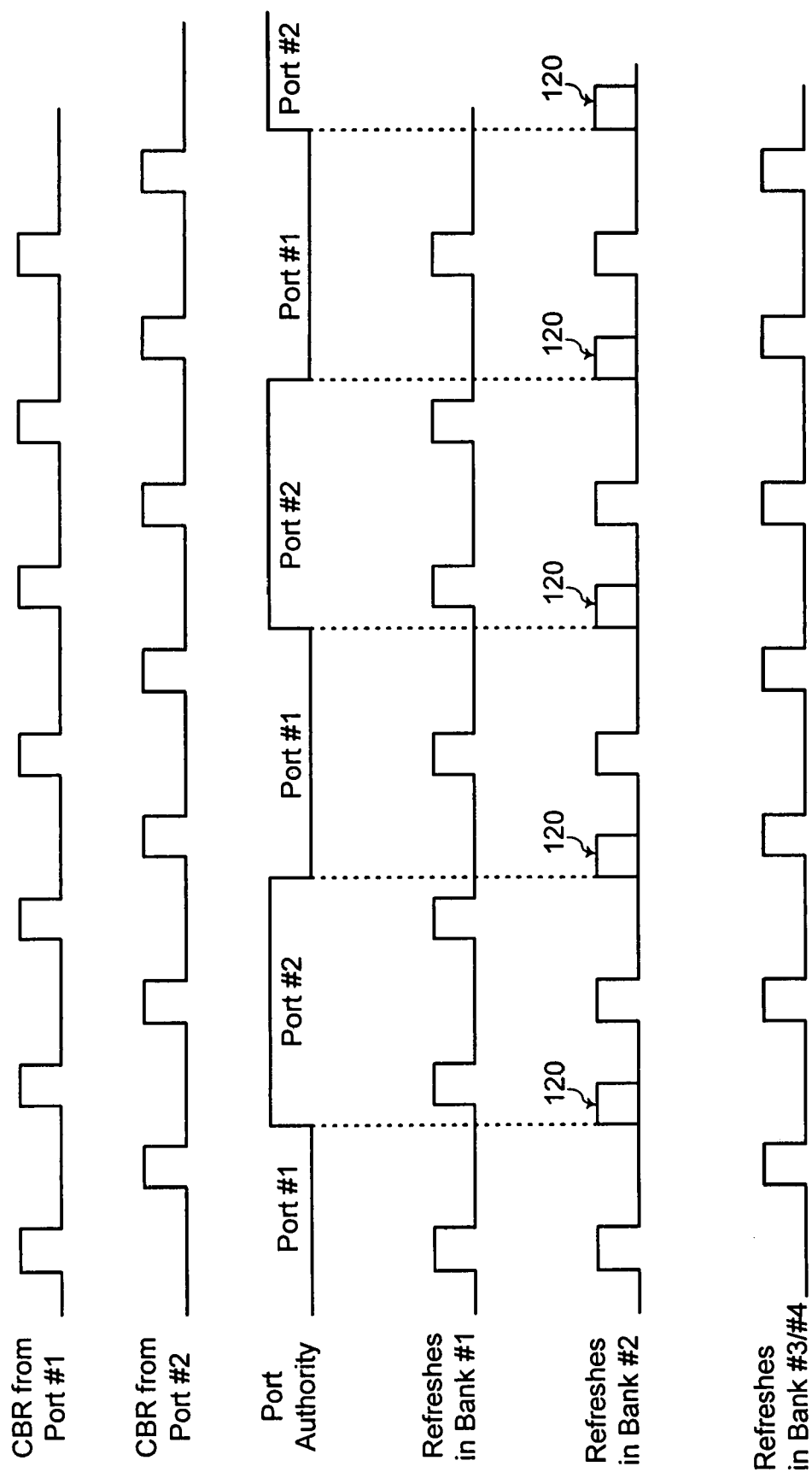
Figure 12:
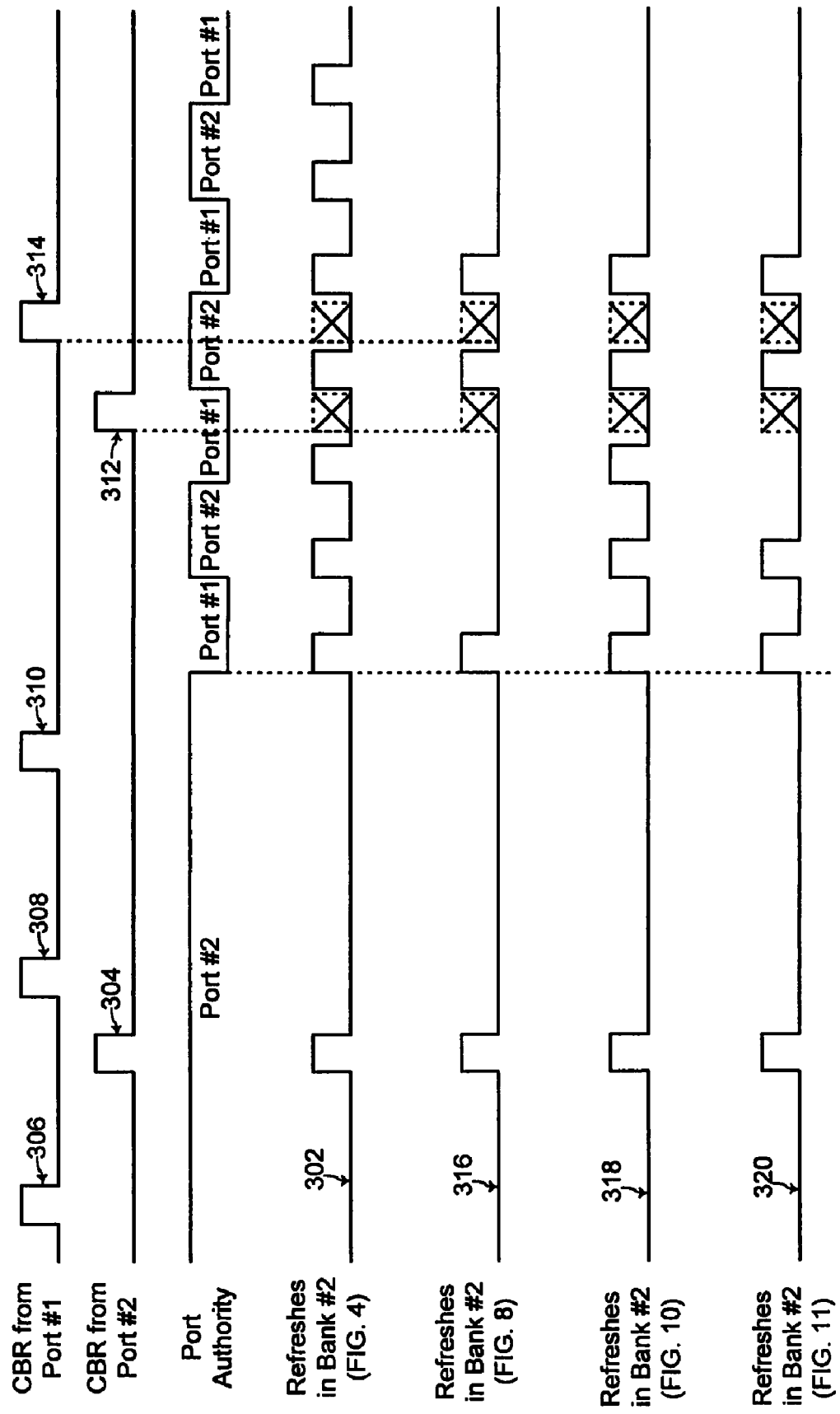
FIGS. 12 and 13 each show a timing diagram illustrating a comparison of various embodiments of the present invention with the prior art for prevention of refresh starvation.

FIG. 12 shows an example timing diagram illustrating a comparison of embodiments of the present invention as illustrated in FIGS. 8, 10, and 11 with the prior art embodiment of FIG. 4 for prevention of refresh starvation. Referring to FIG. 12, a timing diagram 302 shows refresh operations performed in the shared memory bank 230 including a command (i.e., auto) refresh operation from an authorized CBR command 304 and internal refresh operations at each transition of port authority as described with reference to FIG. 4.

FIG. 12 also shows a timing diagram 316 illustrating refresh operations performed in the shared memory bank 230 according to the embodiment of FIG. 8. Thus, the timing diagram 316 shows the command refresh operation from the authorized CBR command 304 and a respective internal refresh operation at each transition of port authority after each of the unauthorized CBR commands 310, 312, and 314.

FIG. 12 further shows a timing diagram 318 illustrating refresh operations performed in the shared memory bank 230 according to the embodiment of FIG. 10. Thus, the timing diagram 318 shows the command refresh operation from the authorized CBR command 304 and three internal refresh operations at subsequent transitions of port authority after the three unauthorized CBR commands 306, 308, and 310. In addition, the timing diagram 318 shows a respective internal refresh operation at each transition of port authority after each of the unauthorized CBR commands 312 and 314.

FIG. 12 additionally shows a timing diagram 320 illustrating refresh operations performed in the shared memory bank 230 according to the embodiment of FIG. 11. Thus, the timing diagram 320 shows the command refresh operation from the authorized CBR command 304 and two internal refresh operations at subsequent transitions of port authority after the three unauthorized CBR commands 306, 308, and 310 and the one authorized CBR command 304. In addition, the timing diagram 320 shows a respective internal refresh operation at each transition of port authority after each of the unauthorized CBR commands 312 and 314.

Figure 13:
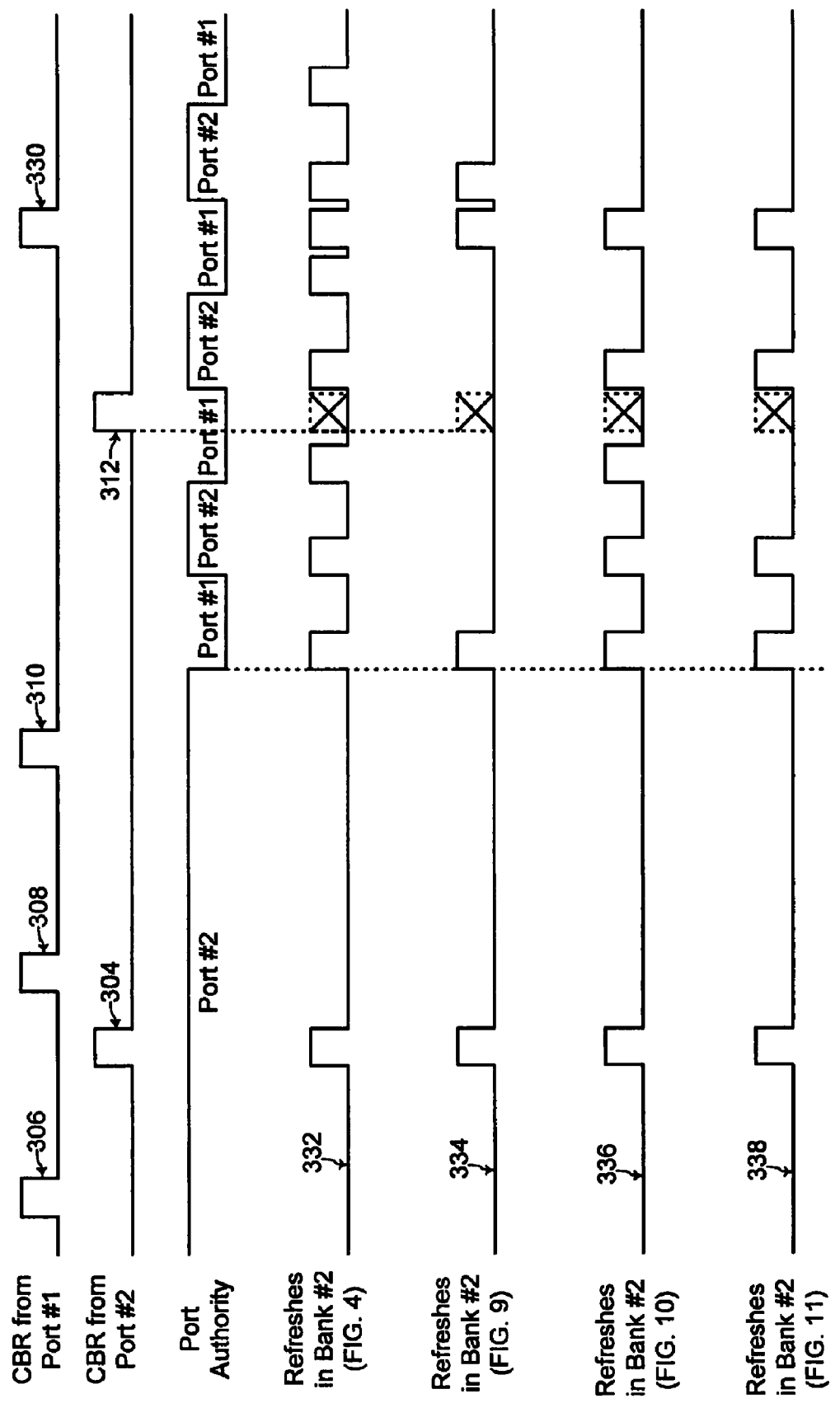

FIG. 13 shows another example timing diagram illustrating a comparison of embodiments of the present invention as illustrated in FIGS. 9, 10, and 11 with the prior art embodiment of FIG. 4 for prevention of refresh starvation. Referring to FIG. 13, a timing diagram 332 shows refresh operations performed in the shared memory bank 230 including command (i.e., auto) refresh operations from authorized CBR commands 304 and 330 and internal refresh operations at each transition of port authority as described with reference to FIG. 4.

FIG. 13 also shows a timing diagram 334 illustrating refresh operations performed in the shared memory bank 230 according to the embodiment of FIG. 9. Thus, the timing diagram 334 shows the command refresh operations from the authorized CBR commands 304 and 330 and a respective internal refresh operation at each transition of port authority after each of the CBR commands 310 and 330 generated from the predetermined port 222.

FIG. 13 further shows a timing diagram 336 illustrating refresh operations performed in the shared memory bank 230 according to the embodiment of FIG. 10. Thus, the timing diagram 336 shows the command refresh operations from the authorized CBR commands 304 and 330 and three internal refresh operations at subsequent transitions of port authority after the three unauthorized CBR commands 306, 308, and 310. In addition, the timing diagram 336 shows a respective internal refresh operation at the transition of port authority after the unauthorized CBR command 312.

FIG. 13 additionally shows a timing diagram 338 illustrating refresh operations performed in the shared memory bank 230 according to the embodiment of FIG. 11. Thus, the timing diagram 338 shows the command refresh operations from the authorized CBR commands 304 and 330 and two internal refresh operations at subsequent transitions of port authority after the three unauthorized CBR commands 306, 308, and 310 and the one authorized CBR command 304. In addition, the timing diagram 338 shows a respective internal refresh operation at the transition of port authority after the unauthorized CBR command 312.

In this manner, sufficient refresh operations are performed in the shared memory bank 230 of the multi-port memory device 220 for prevention of refresh starvation therein. In addition, the number of refresh operations in the embodiments of FIGS. 8, 9, 10, and 11 are not excessive such that operating speed is enhanced and power consumption is minimized.

The foregoing is by way of example only and is not intended to be limiting. Thus, any number of elements as illustrated and described herein is by way of example only. In addition, the present invention has been described for the multi-port semiconductor DRAM device 220. However, the present invention may be practiced for any type of memory device having refresh operations. In addition, the present invention may be practiced with any type of memory unit for each of the dedicated memory banks and the shared memory bank. Furthermore, the present invention may be practiced for preventing refresh starvation in any number of shared memory banks.

The present invention is limited only as defined in the following claims and equivalents thereof.

The invention claimed is:

1. A method of performing refresh operation in a memory device having multiple ports, the method comprising:
   setting a refresh register when an unauthorized refresh command is generated by one of the ports not having access to the memory device;
   activating an internal refresh signal for performing an internal refresh operation in the memory device at a subsequent transition in port authority if said refresh register has been set; and
   activating a refresh by command signal such that a command refresh operation is performed in the memory device when an authorized refresh command is generated by one of the ports having access to the memory device;
   wherein a state of the refresh by command signal is not determined by any information in said refresh register; and
   wherein the internal refresh signal and the refresh by command signal are separate signals; and
   wherein said refresh register is set when a first unauthorized refresh command is generated by a first port of said multiple ports not having access to the memory device, and wherein said refresh register is further set when a second unauthorized refresh command is generated by a second port of said multiple ports not having access to the memory device; and
   wherein said refresh by command signal is activated when the first authorized refresh command is generated by the first port of said multiple ports having access to the memory device, and wherein said refresh by command signal is activated when the second authorized refresh command is generated by the second port of said multiple ports having access to the memory device.

2. The method of claim 1, wherein the internal refresh operation is for a shared memory unit in the memory device, and wherein the shared memory unit has shared access among said multiple ports of the memory device.

3. The method of claim 2, further comprising:
   generating a port authority signal within the memory device for indicating the port authority among the multiple ports.

4. The method of claim 2, further comprising:
   resetting the refresh register after said internal refresh operation has been activated in the shared memory unit;
   disabling by the memory device an internal refresh operation in the shared memory unit at another subsequent transition in port authority after the refresh register is reset;
   setting the refresh register when another unauthorized refresh command is generated after the refresh register has been reset; and
   activating by the memory device another internal refresh operation in the shared memory unit at another subsequent transition in port authority after the refresh register is thus set.

5. The method of claim 2, further comprising:
   setting the refresh register when an unauthorized refresh command is generated from any of the multiple ports.

6. The method of claim 2, further comprising:
   setting the refresh register when any type of refresh command is generated only from a predetermined one of the multiple ports.

7. The method of claim 2, further comprising:
   incrementing a refresh count in the refresh register every time an unauthorized refresh command is generated;
   activating by the memory device the internal refresh operation in the shared memory unit at the subsequent transition in port authority if the refresh count is greater than zero;
   decrementing the refresh count after said internal refresh operation in the shared memory unit is activated; and
   decrementing the refresh count every time an authorized refresh command is executed in the shared memory unit.

8. The method of claim 2, wherein the memory device is a semiconductor DRAM (dynamic random access memory) device, and wherein the shared memory unit is a shared memory bank.

9. A memory device comprising:
   a shared memory unit;
   a plurality of ports sharing access to the shared memory unit;
   a refresh register that is set when an unauthorized refresh command is generated by one of the ports not having access to the memory device;
   a refresh controller that activates an internal refresh signal for performing an internal refresh operation at a subsequent transition in port authority if said refresh register has been set; and
   a refresh command multiplexer that activates a refresh by command signal such that a command refresh operation is performed in the memory device when an authorized refresh command is generated by one of the ports having access to the memory device,
   wherein the refresh by command signal is not determined by any information in said refresh register; and
   wherein the internal refresh signal and the refresh by command signal are separate signals; and
   wherein said refresh register is set when a first unauthorized refresh command is generated by a first port of said plurality of ports not having access to the memory device, and wherein said refresh register is further set when a second unauthorized refresh command is generated by a second port of said plurality of ports not having access to the memory device; and
   wherein said refresh by command signal is activated when the first authorized refresh command is generated by the first port of said multiple ports having access to the memory device, and wherein said refresh by command signal is activated when the second authorized refresh command is generated by the second port of said multiple ports having access to the memory device.

10. The memory device of claim 9, further comprising:
    an authority controller for generating a port authority signal indicating the port authority between the ports.

11. The memory device of claim 9, wherein the refresh controller resets the refresh register after said internal refresh operation has been activated in the shared memory unit, and wherein the refresh controller controls the shared memory unit to not perform an internal refresh operation in the shared memory unit at another subsequent transition in port authority after the refresh register is reset; and
    wherein the refresh controller sets the refresh register when another unauthorized refresh command is generated after the refresh register has been reset, and wherein the refresh controller controls the shared memory unit to perform an internal refresh operation at another subsequent transition in port authority after the refresh register is thus set.

12. The memory device of claim 9, wherein the refresh controller sets the refresh register when an unauthorized refresh command is generated from any of the plurality of ports.

13. The memory device of claim 9, wherein the refresh controller sets the refresh register when any type of refresh command is generated only from a predetermined one of the plurality of ports.

14. The memory device of claim 9, wherein the refresh register stores a refresh count that is incremented by the refresh controller every time an unauthorized refresh command is generated, and wherein the refresh controller controls the shared memory unit to perform the internal refresh operation at the subsequent transition in port authority if the refresh count is greater than zero, and wherein the refresh controller decrements the refresh count after said internal refresh operation in the shared memory unit is activated; and wherein the refresh controller decrements the refresh count every time an authorized refresh command is executed in the shared memory unit.

15. The memory device of claim 9, wherein the memory device is a semiconductor DRAM (dynamic random access memory) device, and wherein the shared memory unit is a shared memory bank.

16. A memory system comprising:
a first dedicated memory unit accessed by a first data processor;
a second dedicated memory unit accessed by a second data processor;
a shared memory unit accessed by the first data processor through a first port and by the second data processor through a second port;
a refresh register that is set when an unauthorized refresh command is generated by one of the ports not having access to the memory device;
a refresh controller that activates an internal refresh signal for performing an internal refresh operation at a subsequent transition in port authority if said refresh register has been set; and
a refresh command multiplexer that activates a refresh by command signal such that a command refresh operation is performed in the memory device when an authorized refresh command is generated by one of the ports having access to the memory device,
wherein the refresh by command signal is not determined by any information in said refresh register; and
wherein the internal refresh signal and the refresh by command signal are separate signals; and
wherein said refresh register is set when a first unauthorized refresh command is generated by said first port not having access to the memory device, and wherein said refresh register is further set when a second unauthorized refresh command is generated by said second port not having access to the memory device; and
wherein said refresh by command signal is activated when the first authorized refresh command is generated by the first port of said multiple ports having access to the memory device, and wherein said refresh by command signal is activated when the second authorized refresh command is generated by the second port of said multiple ports having access to the memory device.

17. The memory system of claim 16, further comprising:
an authority controller for generating a port authority signal indicating the port authority between the ports.

18. The memory system of claim 16, wherein the first and second dedicated memory units and the shared memory unit are formed in a core of a semiconductor memory device; and
wherein the refresh register and the refresh controller are formed as part of the semiconductor memory device.

19. The memory system of claim 16, wherein the refresh controller resets the refresh register after said internal refresh operation has been activated in the shared memory unit, and wherein the refresh controller controls the shared memory unit to not perform an internal refresh operation in the shared memory unit at another subsequent transition in port authority after the refresh register is reset.

20. The memory system of claim 16, wherein the refresh controller sets the refresh register when an unauthorized refresh command is generated from any of the ports.

21. The memory system of claim 16, wherein the refresh controller sets the refresh register when any type of refresh command is generated only from a predetermined one of the ports.

22. The memory system of claim 16, wherein the refresh register stores a refresh count that is incremented by the refresh controller every time an unauthorized refresh command is generated, and wherein the refresh controller controls the shared memory unit to perform the internal refresh operation at the subsequent transition in port authority if the refresh count is greater than zero, and wherein the refresh controller decrements the refresh count after said internal refresh operation in the shared memory unit is activated; and wherein the refresh controller decrements the refresh count every time an authorized refresh command is executed in the shared memory unit.

23. The memory system of claim 16, wherein the shared memory unit is a shared memory bank of a semiconductor DRAM (dynamic random access memory) device that is installed in a mobile device.

* * * * *